United States Patent
Saito et al.

(10) Patent No.: US 11,955,775 B2
(45) Date of Patent: Apr. 9, 2024

(54) QUANTUM CASCADE LASER AND METHOD FOR MANUFACTURING SAME

(71) Applicant: KABUSHIKI KAISHA TOSHIBA, Minato-ku (JP)

(72) Inventors: Shinji Saito, Yokohama (JP); Kei Kaneko, Yokohama (JP); Rei Hashimoto, Edogawa (JP); Tsutomu Kakuno, Fujisawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 8 days.

(21) Appl. No.: 16/898,535

(22) Filed: Jun. 11, 2020

(65) Prior Publication Data
US 2021/0091540 A1    Mar. 25, 2021

(30) Foreign Application Priority Data
Sep. 24, 2019  (JP) ................ 2019-173448

(51) Int. Cl.
*H01S 5/34*    (2006.01)
*H01S 5/343*   (2006.01)

(52) U.S. Cl.
CPC .......... *H01S 5/3402* (2013.01); *H01S 5/3407* (2013.01); *H01S 5/34313* (2013.01); *H01S 5/34366* (2013.01); *H01S 2304/02* (2013.01)

(58) Field of Classification Search
CPC .................. H01S 5/3407; H01S 5/3401–3402
See application file for complete search history.

(56) References Cited

U.S. PATENT DOCUMENTS 4,712,121 A * 12/1987 Yokoyama ............ H01L 29/205
                                                    257/26
5,081,511 A *  1/1992 Tehrani .................. B82Y 10/00
                                                    257/E29.069
(Continued)

FOREIGN PATENT DOCUMENTS

DE    101 43 956 A1    4/2003
JP    H05109622 A      4/1993
(Continued)

OTHER PUBLICATIONS

Xu et al., "Surface-emitting quantum cascade lasers with metallic photonic-crystal resonatoras", Applied Physics Letters, 94, 221101, 2009, 4 pages.

Primary Examiner — Sean P Hagan
(74) Attorney, Agent, or Firm — Maier & Maier, PLLC

(57) ABSTRACT

A quantum cascade laser includes light-emitting quantum well layers configured to emit infrared laser light by an intersubband transition; and injection quantum well layers configured to relax carrier energy. The light-emitting quantum well layers and the injection quantum well layers are stacked alternately. The injection quantum well layers relax the energy of carriers injected from the light-emitting quantum well layers, respectively. The light-emitting quantum well layers and the injection quantum well layers including barrier layers. At least one barrier layer includes first and second regions of a first ternary compound semiconductor, and a binary compound semiconductor thin film. The binary compound semiconductor thin film is provided between the first and second regions. The first ternary compound semiconductor includes Group III atoms and a Group V atom. The binary compound semiconductor thin film includes one Group III atom of the first ternary compound semiconductor and the Group V atom.

6 Claims, 8 Drawing Sheets

(56) References Cited

U.S. PATENT DOCUMENTS

| | | | | |
|---|---|---|---|---|
| 5,172,384 | A * | 12/1992 | Goronkin | B82Y 20/00 |
| | | | | 372/45.01 |
| 5,457,709 | A * | 10/1995 | Capasso | B82Y 20/00 |
| | | | | 372/45.01 |
| 6,023,482 | A * | 2/2000 | Capasso | B82Y 20/00 |
| | | | | 372/45.01 |
| 7,280,576 | B2 * | 10/2007 | Calcott | H01S 5/343 |
| | | | | 372/45.011 |
| 2003/0219052 | A1 | 11/2003 | Goodhue et al. | |
| 2005/0036530 | A1 | 2/2005 | Schneider et al. | |
| 2005/0226296 | A1 * | 10/2005 | Botez | B82Y 20/00 |
| | | | | 372/45.01 |
| 2008/0048792 | A1 | 2/2008 | Ouchi et al. | |
| 2010/0097690 | A1 * | 4/2010 | Vurgaftman | H01S 5/3401 |
| | | | | 359/344 |
| 2013/0136148 | A1 * | 5/2013 | Caneau | B82Y 20/00 |
| | | | | 372/45.01 |
| 2014/0042388 | A1 | 2/2014 | Hwang et al. | |
| 2015/0131689 | A1 * | 5/2015 | Gmachl | H01S 5/2004 |
| | | | | 372/45.012 |
| 2017/0271849 | A1 | 9/2017 | Saito et al. | |
| 2019/0074663 | A1 | 3/2019 | Saito et al. | |
| 2022/0059995 | A1 * | 2/2022 | Kato | H01S 5/34313 |

FOREIGN PATENT DOCUMENTS

| | | | |
|---|---|---|---|
| JP | H05267168 | A | 10/1993 |
| JP | 2000053494 | A | 2/2000 |
| JP | 2010-278326 | A | 12/2010 |
| JP | 5509275 | B2 | 6/2014 |
| JP | 2017-168594 | A | 9/2017 |
| JP | 2018093023 | A | 6/2018 |
| JP | 2019-047023 | A | 3/2019 |

* cited by examiner

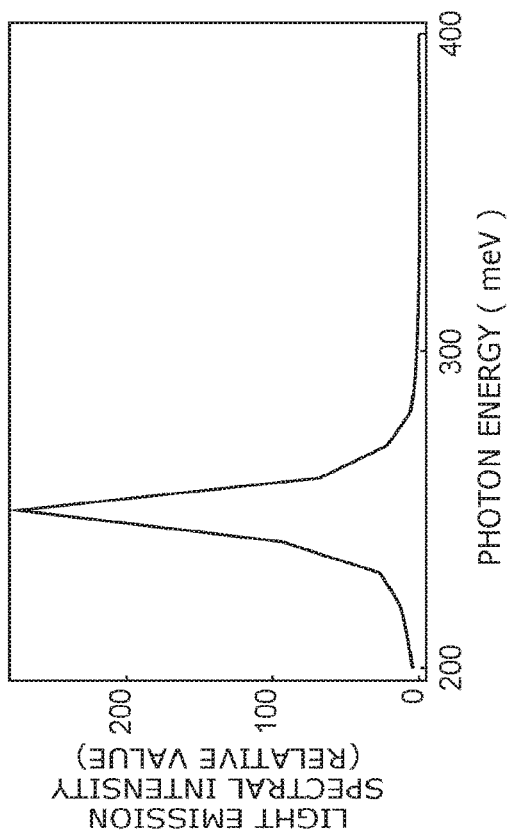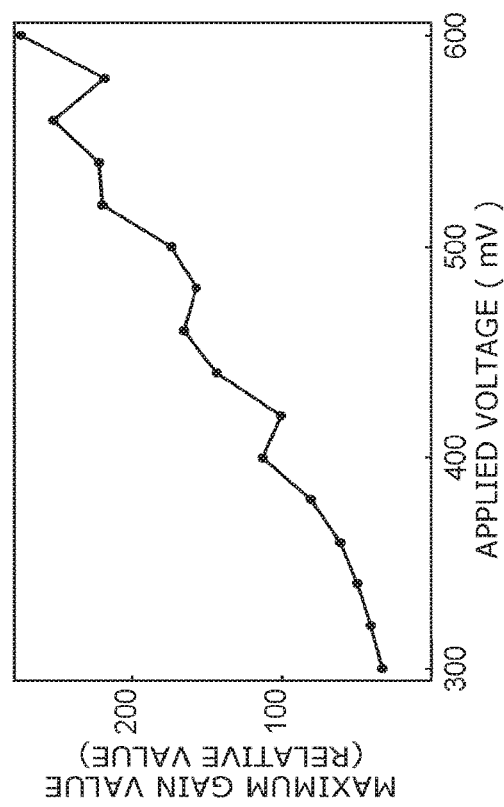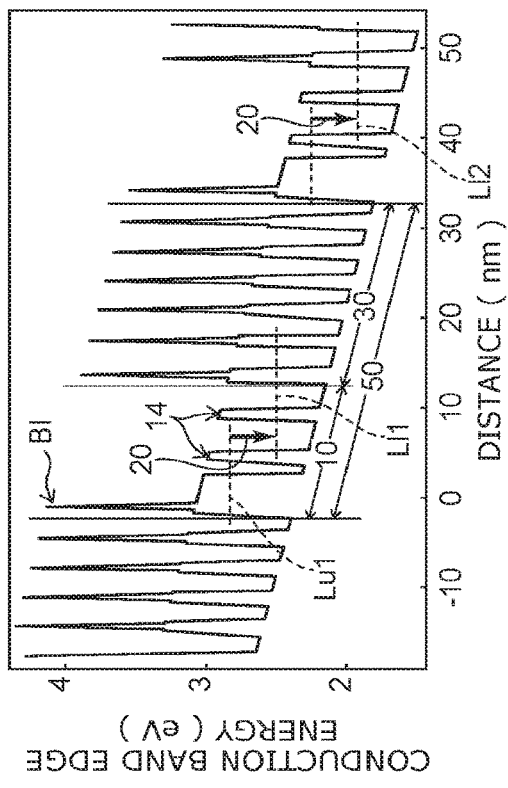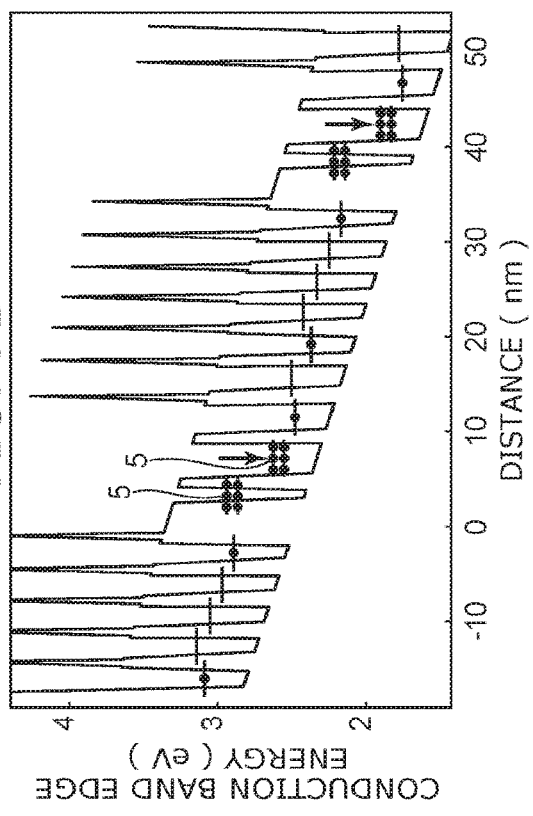

QUANTUM CASCADE LASER AND METHOD FOR MANUFACTURING SAME

CROSS-REFERENCE TO RELATED APPLICATIONS

This application is based upon and claims the benefit of priority from Japanese Patent Application No. 2019-173448, filed on Sep. 24, 2019; the entire contents of which are incorporated herein by reference.

FIELD

Embodiments relate to a quantum cascade laser and a method for manufacturing the same.

BACKGROUND

A quantum cascade laser includes a quantum well layer configured by compound semiconductors such as InGaAs/InAlAs which have prescribed composition ratios.

The quantum well layer is formed by a crystal growth using an MBE (Molecular Beam Epitaxy) apparatus or the like in which the composition ratios can be controlled by changing the vapor pressure ratios of elemental components heated respectively in crucibles or the like.

The crystal growth of multi-quantum well layers including the compound semiconductors are generally performed so that the composition ratios thereof are maintained to be constant by keeping the respective temperatures in the crucibles constant. Since the temperatures of the crucibles cannot be changed abruptly, it is difficult to flexibly change the composition ratios.

On the other hand, large flexibility may be required in the quantum well design for improving the light emission characteristics such as luminous efficiency or the like. To achieve such a quantum well layer, it is desired to freely controlling the well layer depth and/or the barrier layer height.

BRIEF DESCRIPTION OF THE DRAWINGS

FIG. 7A is an energy band diagram of a quantum cascade laser according to a modification of the first embodiment;

FIG. 7B is a density-of-states diagram of the quantum cascade laser according to the modification of the first embodiment;

FIG. 7C is a light emission spectrograph of the quantum cascade laser according to the modification of the first embodiment;

FIG. 7D is a graph illustrating the gain dependence on the applied voltage of the quantum cascade laser according to the modification of the first embodiment.

DETAILED DESCRIPTION

According to an embodiment, a quantum cascade laser includes a plurality of light-emitting quantum well layers configured to emit infrared laser light by using an intersubband transition; and a plurality of injection quantum well layers configured to relax carrier energy. The light-emitting quantum well layers and the injection quantum well layers are stacked alternately. The injection quantum well layers relax the energy of carriers injected from the light-emitting quantum well layers, respectively. The light-emitting quantum well layers and the injection quantum well layers including barrier layers. At least one barrier layer includes a first region, a binary compound semiconductor thin film and a second region. The binary compound semiconductor thin film is provided between the first and second regions. The first and second regions are of a first ternary compound semiconductor including Group III atoms and a Group V atom. The binary compound semiconductor thin film includes one Group III atom of the first ternary compound semiconductor and the Group V atom.

Embodiments of the invention will now be described with reference to the drawings.

Figure 1:
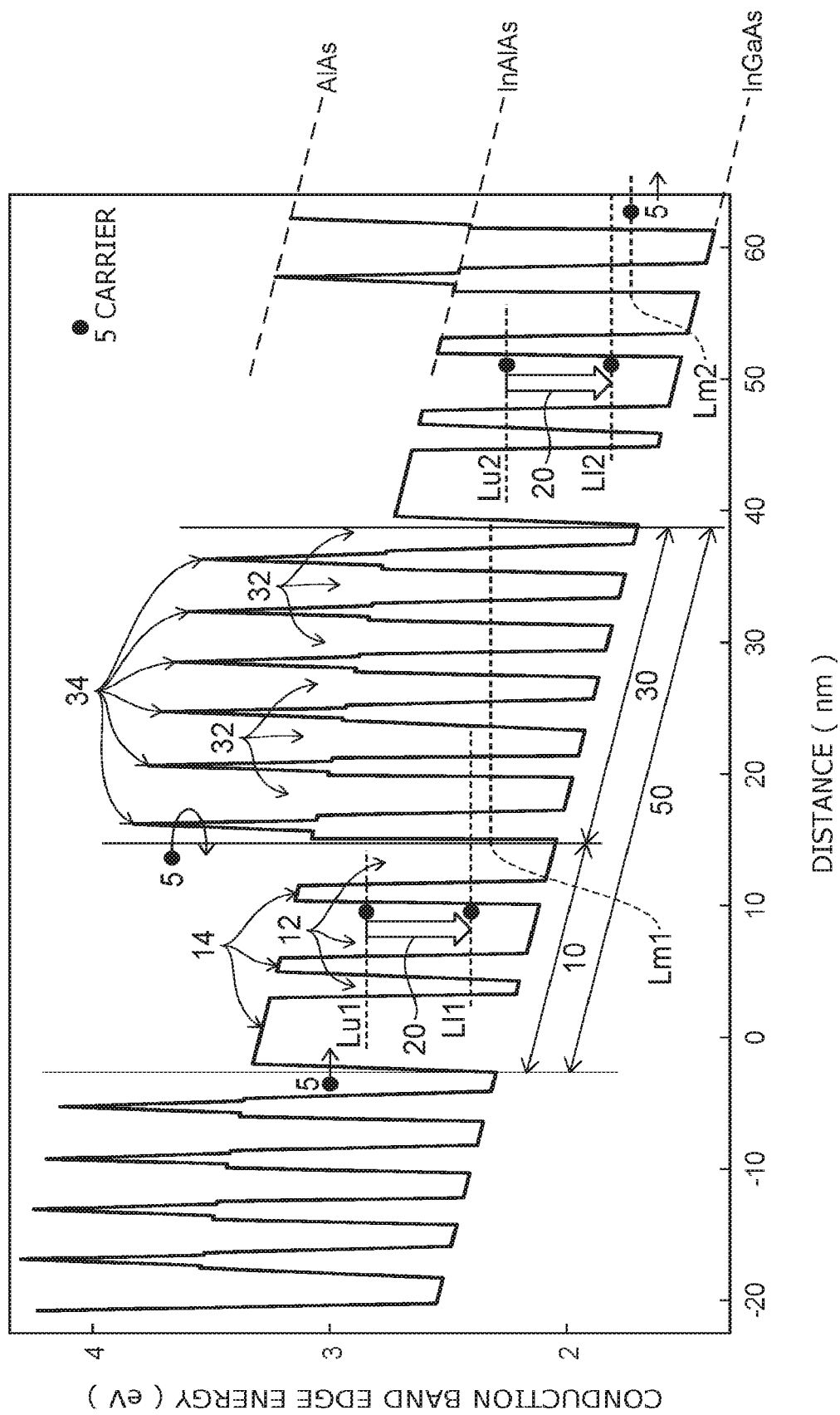
FIG. 1 is an energy band diagram of a quantum cascade laser according to a first embodiment.

FIG. 1 is an energy band diagram of a quantum cascade laser according to a first embodiment.

The vertical axis is the conduction band edge energy (eV), and the horizontal axis is the distance (nm) in the depth direction.

The quantum cascade laser includes a light-emitting quantum well layer 10 and an injection quantum well layer 30. The energy band diagram is inclined due to the applied voltage.

The light-emitting quantum well layer 10 is configured to emit infrared laser light corresponding to an intersubband transition. The injection quantum well layer 30 is configured to relax the energy of a carrier 5 injected from the light-emitting quantum well layer 10. Multiple light-emitting quantum well layers 10 and multiple injection quantum well layers 30 are provided. The light-emitting quantum well layers 10 and the injection quantum well layers 30 are stacked alternately. A unit stacked body 50 including a pair of the light-emitting quantum well layer 10 and the injection quantum well layer 30. The stacked number of unit stacked body 50 can be, for example, 10 to 100, etc.

The unit stacked body 50 includes, for example, first and second ternary compound semiconductors and a binary compound semiconductor. The light-emitting quantum well layer 10 includes a well layer 12 and a barrier layer 14. The well layer 12 includes the second ternary compound semiconductor. The barrier layer 14 includes the first ternary compound semiconductor. The injection quantum well layer 30 includes a well layer 32 and a barrier layer 34. The well layer 32 includes the second ternary compound semiconductor. The barrier layer 34 includes at least first and second regions of the first ternary compound semiconductor. The barrier layer 34 of the injection quantum well layer 30 can further include a thin film of the binary compound semiconductor that is interposed between the first and second regions. The binary compound semiconductor includes the Group V atom and one atom of the Group III atoms. It is possible in the crystal growth process to improve the productivity by using the multi-quantum well (MQW) layer, which includes the compound semiconductor having the same composition ratio, for the light-emitting quantum well layer 10 and the injection quantum well layer 30.

In the diagram, it is taken that an electron 5 which is the carrier moves toward the right side of the diagram where the conduction band edge energy is lower. The electron 5 undergoes an intersubband transition 20 at the central well layer of the three well layers 12 in the light-emitting quantum well layer 10. When the thickness of the well layer 12 in the light-emitting quantum well layer 10 is set to 10 nm or less, subband levels are formed by quantization of the energy band. In the diagram, the high subband levels are illustrated by Lu1 and Lug, and the low subband levels are illustrated by Ll1 and Ll2. The mini-band levels of the electron 5 relaxed in the injection quantum well layer 30 are illustrated by Lm1 and Lm2.

In the first embodiment, the barrier height of the barrier layer 34 in the injection quantum well layer 30 is greater than the barrier height of the barrier layer 14 in the light-emitting quantum well layer 10. The ratio of carriers 5 is reduced thereby, which are injected via a high level from the upstream side into the unit stacked body 50, move toward the downstream side, and leak into the injection quantum well layer 30 without contributing to the light emission in the light-emitting quantum well layer 10. Therefore, the luminous efficiency can be increased. The binary compound thin film is thin enough not to form a quantized level in the first and second regions of the first ternary compound semiconductor. For example, when a wide bandgap layer having a high conduction band edge energy and a narrow bandgap layer having a low conduction band edge energy are stacked alternately, and a thickness of the wide bandgap layer is not enough to confine an electron in the narrow bandgap layer, the energy band of the narrow bandgap layer is not quantized.

In the embodiment, the second ternary compound semiconductor is, for example, $In_xGa_{1-x}As$. The first ternary compound semiconductor is, for example, $In_yAl_{1-y}As$. It is easy to stack, for example, 10 to 100 layers of the unit stacked bodies 50 by MBE, when the unit stacked bodies 50 includes these materials. The light emission wavelengths by such materials are of near-infrared to mid-infrared light.

Figure 2:
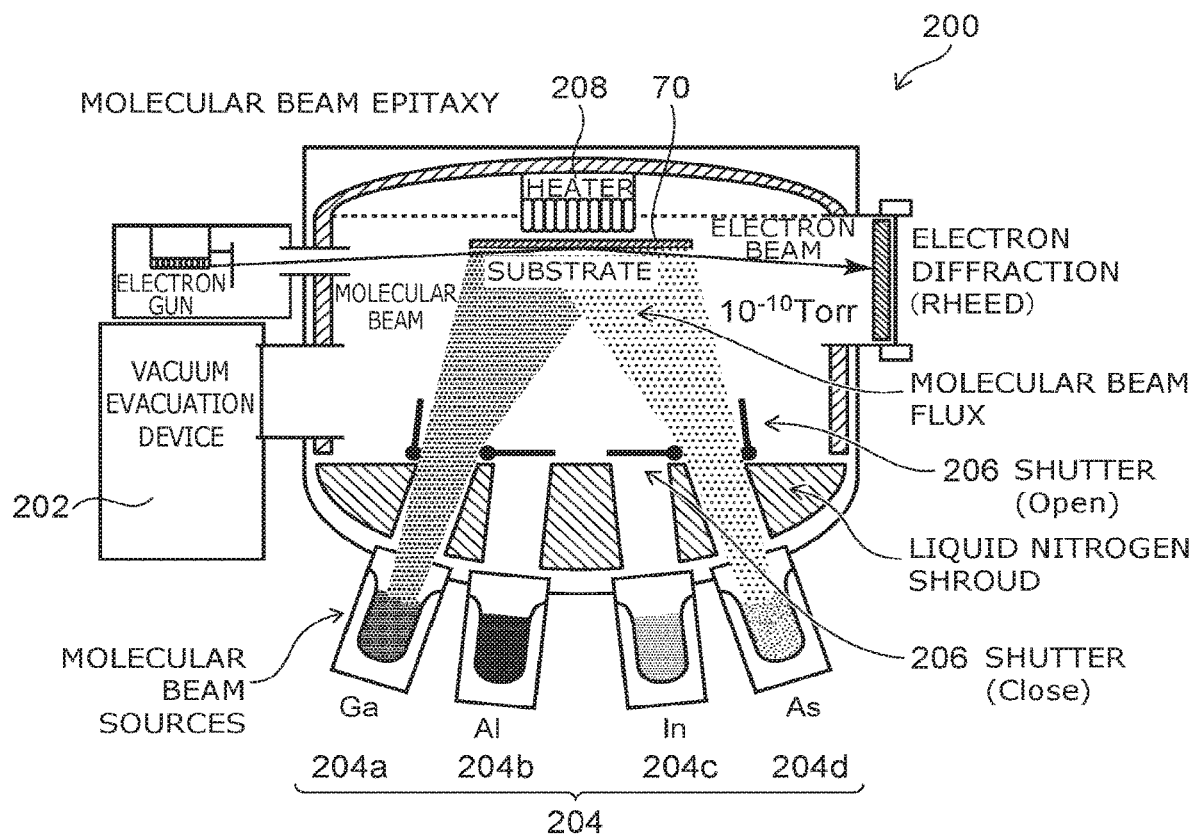
FIG. 2 is a schematic view of the MBE apparatus.

An MBE (Molecular Beam Epitaxy) apparatus will now be described. FIG. 2 is a schematic view of the MBE apparatus 200.

The MBE apparatus 200 includes a vacuum evacuation part 202, molecular beam sources 204, shutters 206, a heater 208, etc. The shutters 206 open and close the molecular beam sources 204, respectively. The heater 208 heats a substrate. In the drawing, for example, In, Ga, and Al as Group III atoms and As as a Group V atom are prepared as the molecular beam sources 204 (204a to 204d). The Group III and Group V atoms are stored in crucibles, heated, and respectively controlled to prescribed temperatures in 0.1° C. units. The composition ratios of the compound semiconductors can be changed by changing the vapor pressure ratios around the surface of the substrate. The vapor pressure ratios are changed depending on the temperatures of the molecular beam sources 204 that are changed by the temperatures of the crucibles.

However, it is difficult to change the temperatures of the crucibles more abruptly than 10° C./minute. Therefore, the crystal growth is generally performed under the constant temperatures of the crucibles while each layer of the quantum well layers is grown. As a result, normally, the composition ratio of the compound semiconductor is constant in each layer of the quantum well layers.

Figure 3:
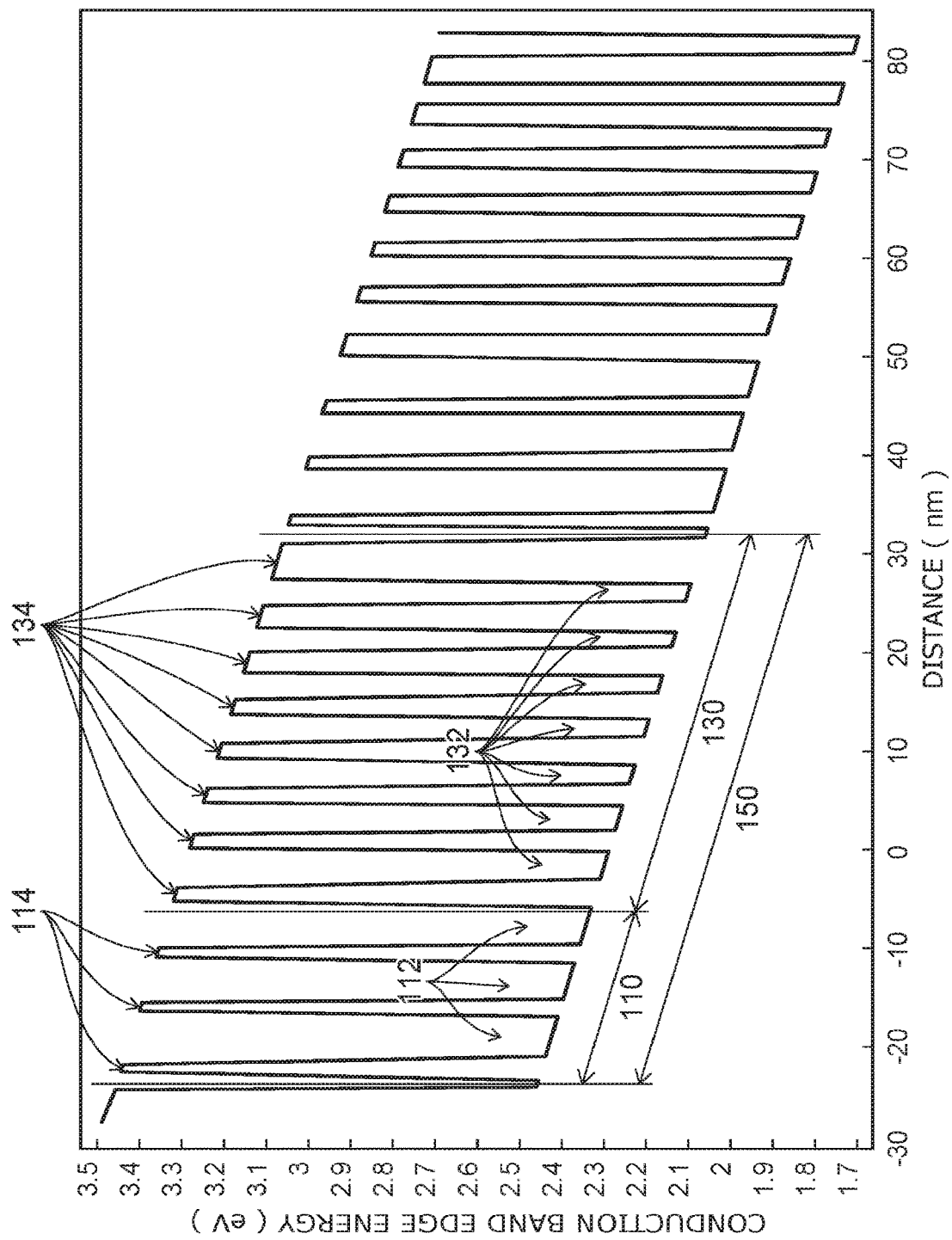
FIG. 3 is an energy band diagram of a quantum cascade laser according to a comparative example.

FIG. 3 is an energy band diagram of a quantum cascade laser according to a comparative example.

The vertical axis is the conduction band edge energy (eV), and the horizontal axis is the relative distance (nm) in the depth direction. The quantum cascade laser includes a unit stacked body 150 including a light-emitting quantum well layer 110 and an injection quantum well layer 130. A well layer 112 of the light-emitting quantum well layer 110 and a well layer 132 of the injection quantum well layer 130 are made of the compound semiconductor having the same composition. Also, a barrier layer 114 of the light-emitting quantum well layer 110 and a barrier layer 134 of the injection quantum well layer 130 are made of the compound semiconductor having the same composition.

In the case of the comparative example, the barrier height of the barrier layer 114 in the light-emitting quantum well layer 110 is the same as the barrier height of the barrier layer 134 in the injection quantum well layer 130. The carriers (the electrons) injected into the unit stacked body 150 from the injection quantum well layer 130 at the upstream side are divided into a portion contributing to the light emission corresponding to intersubband transitions in the light-emitting quantum well layer 110, and other portion leaking into the injection quantum well layer 130 without contributing to the light emission. Therefore, the luminous efficiency is reduced by the ratio of carriers leaking into the injection quantum well layer 130.

Figure 4:
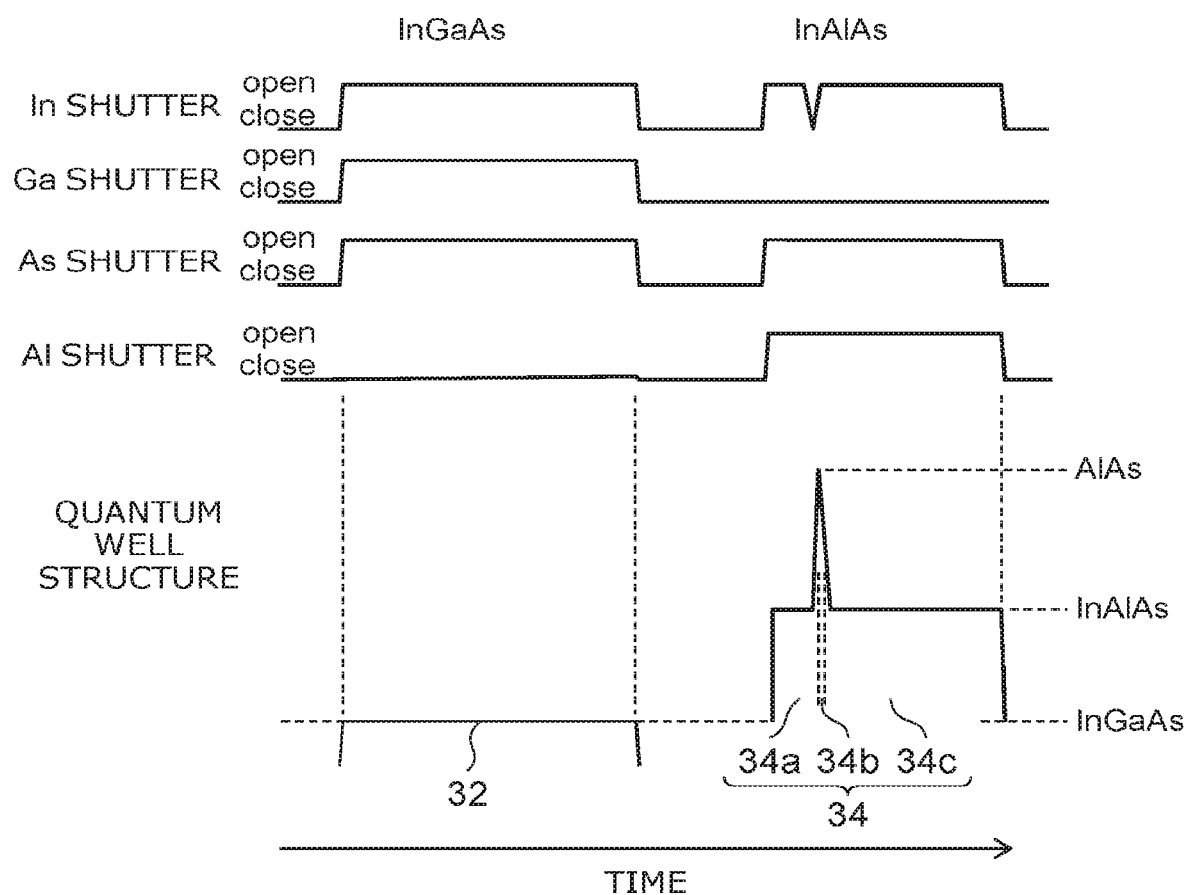
FIG. 4 is a descriptive view of a method of changing the composition ratios of the compound semiconductors using shutters.

FIG. 4 is a descriptive view of a method of changing the composition ratios of the compound semiconductors using shutters.

In the vertical direction, the states of the shutter (open or close) are expressed, and the horizontal axis is time. The InGaAs well layer can be formed by performing crystal growth in the state where In shutter is open; Ga shutter is open; As shutter is open; and Al shutter is closed. The InAlAs barrier layer can be formed by performing crystal growth in the state where In shutter is open; Ga shutter is closed; As shutter is open; and Al shutter is open. The AlAs thin film can be formed by performing crystal growth in the state where In shutter is closed; Ga shutter is closed; As shutter is open; and Al shutter is open. The AlAs layer can be formed not only as a single layer but also as multiple layers by a similar method.

Figure 5:
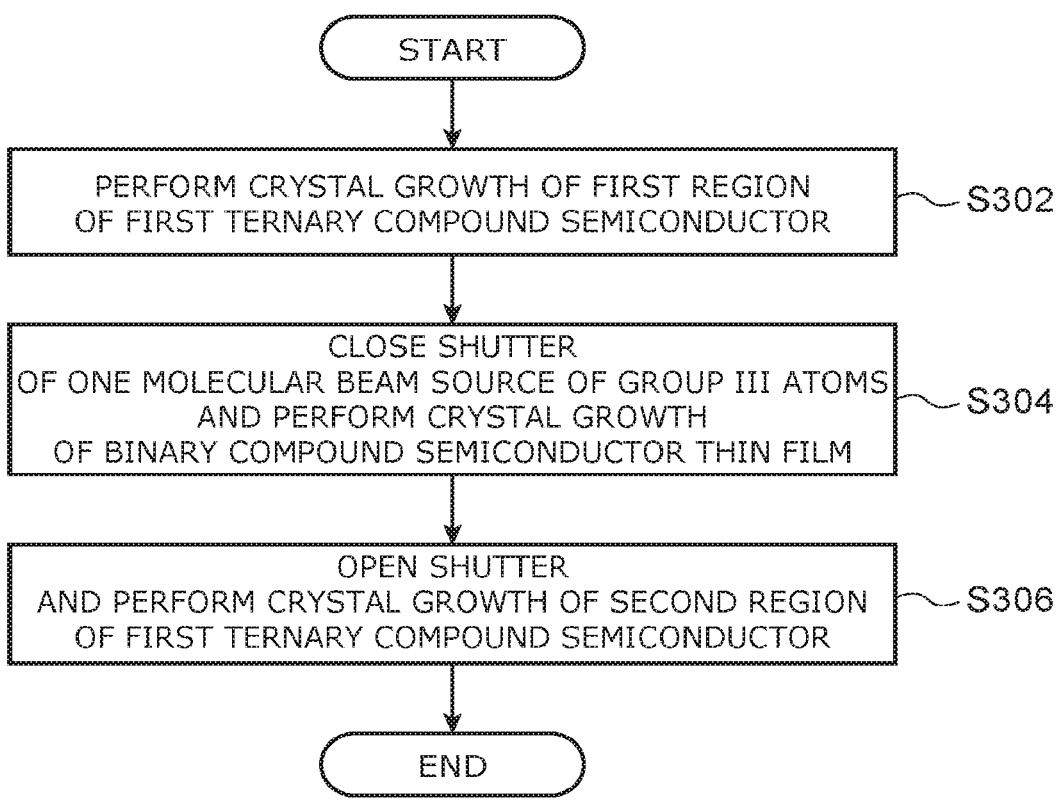
FIG. 5 is a flowchart of forming the barrier layer of the quantum well layer according to the first embodiment.

FIG. 5 is a flowchart of forming the barrier layer of the injection quantum well layer 30 according to the first embodiment.

First, as illustrated in FIG. 4, the crystal growth of the first ternary compound semiconductor is performed to form a first region 34a of the barrier layer 34 of the injection quantum well layer 30 (S302). All of the shutters are opened at the three molecular beam sources that include the three element components of the first ternary compound semiconductor, respectively.

Then, one of the shutters of molecular beam sources including the Group III atoms of the first ternary compound semiconductor is changed from the open state to the closed state, and crystal growth of a binary compound semiconductor thin film 34b is performed using MBE (S304).

Further, the one of the shutters that was closed in step S304 again is opened, and crystal growth of a second region 34c of the barrier layer 34 of the injection quantum well layer 30 is performed (S306).

Thus, the binary compound semiconductor thin film can be provided at the desired location in the barrier layer of the injection quantum well layer 30. It is preferable for the closed state of the one of the shutters to be short so that the binary compound semiconductor thin film 34b is thin. There may be a case where the composition change layers are provided respectively at the boundaries between the region 34a of the ternary compound semiconductor and the binary compound semiconductor thin film 34b and between the binary compound semiconductor thin film 34b and the regions 34c of the ternary compound semiconductor. Moreover, it is preferable in the MBE crystal growth that the ternary compound semiconductor is grown before the binary compound semiconductor so as not to form a dot-shaped defect.

Figure 6:
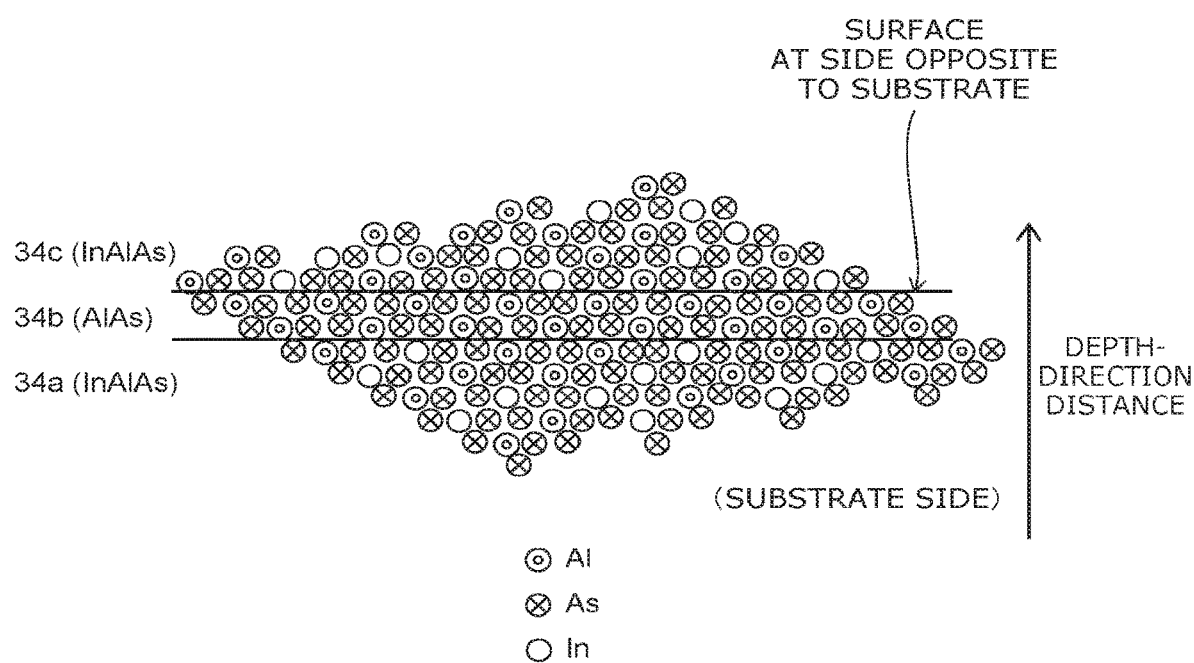
FIG. 6 is a schematic cross-sectional view of the composition of the barrier layer including the binary compound semiconductor thin film.

FIG. 6 is a schematic cross-sectional view of the composition of the barrier layer 34 including the binary compound semiconductor thin film.

The InAlAs first region 34a, the AlAs thin film 34b and the InAlAs second region 34c are grown in this order on a substrate (illustrated by 70 in FIG. 2). It is preferable to perform the crystal growth of the binary compound semiconductor thin film 34b while monitoring the binary compound semiconductor at the surface thereof opposite to the substrate so that the stable surface can be confirmed in which the Group V atoms are arranged. This provides the advantage of preventing a three-dimensional growth mode. Moreover, even when the multiple binary compound semiconductor thin films 34b are provided in the barrier layer of the injection quantum well layer 30, the binary compound semiconductor thin films 34b does not configure the superlattice structure.

FIG. 7A is an energy band diagram of a quantum cascade laser according to a modification of the first embodiment; FIG. 7B is a density-of-states diagram thereof; FIG. 7C is a light emission spectrograph thereof; and FIG. 7D is a graph illustrating the gain dependence on the applied voltage of the quantum cascade laser.

In the modification, one of the barrier layers in the light-emitting quantum well layer 10 includes a binary compound semiconductor thin film. The second ternary compound semiconductor is, for example, $In_xGa_{1-x}As$. The first ternary compound semiconductor is, for example, $In_yAl_{1-y}As$. The intersubband transitions 20 occur between the high level (e.g., Lu1 and Lu2) and the low level (Ll1 and Ll2).

As illustrated in FIG. 7A, the barrier height is increased by the AlAs thin film at the injection barrier layer BI that is located at the upstream side of the light-emitting quantum well layer 10, and it is possible to control the amount of the electrons contributing the intersubband transition by providing the AlAs thin film. That is, the AlAs thin film enlarges the flexibility of the structural design, and makes it possible to increase the luminous efficiency.

FIG. 7B is a graph illustrating the density of states of the band structure. The subband levels are formed in the well layer 12 of the light-emitting quantum well layer 10. The diagram shows that in the light-emitting quantum well layer 10, the density of states of the second well layer and the density of states of the third well layer are higher than the density of states of the other well layer, thereby making the intersubband transition possible. On the other hand, the mini-band levels are formed in the well layers of the injection quantum well layer 30.

FIG. 7C is a light emission spectrograph. The vertical axis is the light emission spectral intensity (a relative value), and the horizontal axis is the photon energy (meV). A high and steep spectrum is obtained because the leakage of the carriers can be suppressed.

FIG. 7D is a graph illustrating the gain dependence on the applied voltage. The vertical axis is the maximum gain value, and the horizontal axis is the applied voltage. The maximum gain value increases as the applied voltage increases.

Figure 8:
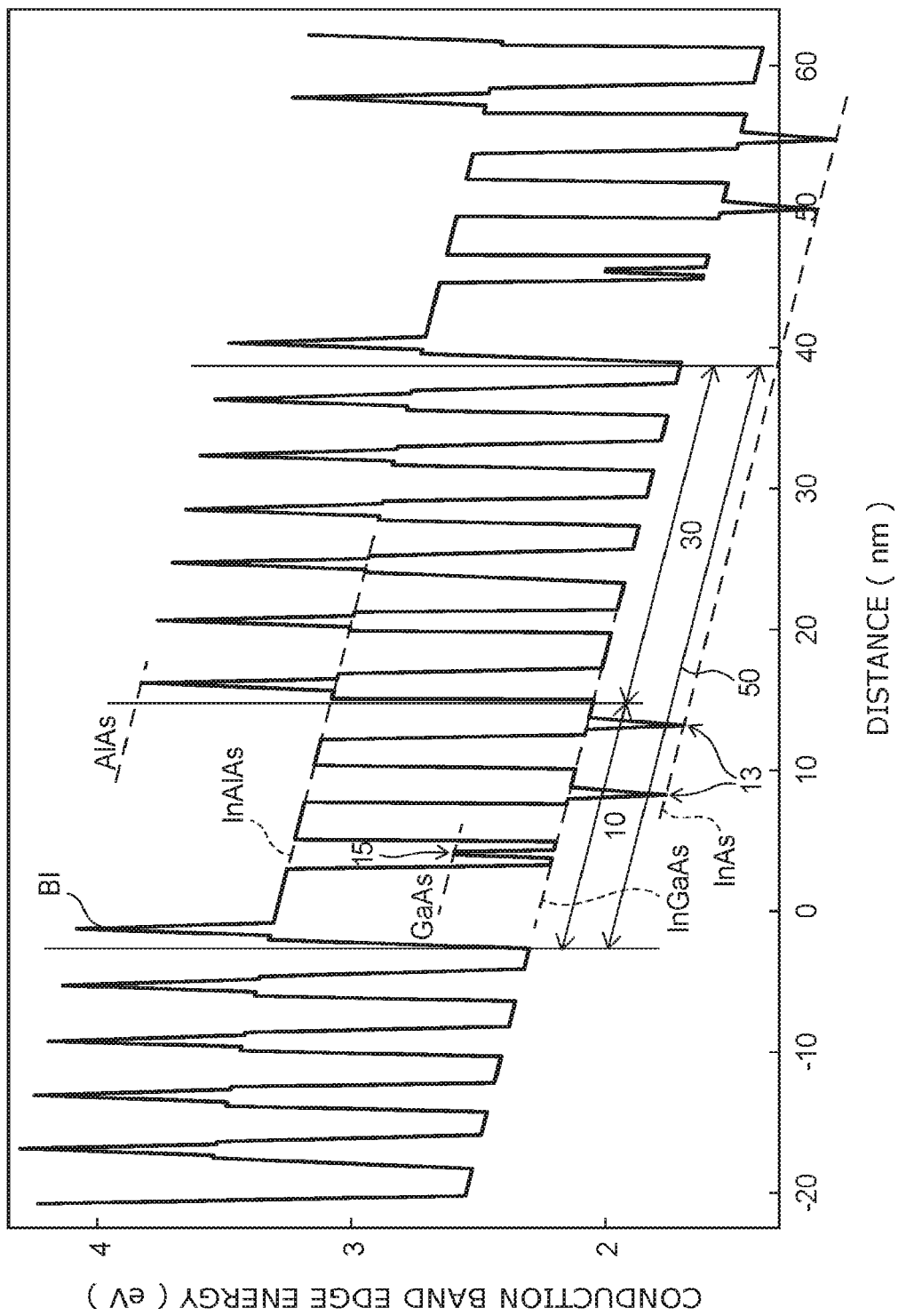
FIG. 8 is a band diagram of a quantum cascade laser according to a second embodiment.

FIG. 8 is a band diagram of a quantum cascade laser according to a second embodiment.

The light-emitting quantum well layers 10 each include well layers 12, 13, barrier layers 14 and 15. The well layer 12 is the second ternary compound semiconductor (see FIG. 1). The well layer 13 is a binary compound semiconductor including the Group III atom and the Group V atom of the second ternary compound semiconductor. The well layer 13 includes one of the Group III atoms in the second ternary compound semiconductor. The barrier layer 14 is the first ternary compound semiconductor (see FIG. 1). The barrier layer 15 is a binary compound semiconductor including the Group III atom and the Group V atom of the second ternary compound semiconductor. The barrier layer 15 includes the other one of the Group III atoms in the second ternary compound semiconductor.

In other words, it is possible in the quantum cascade laser of the second embodiment to enlarge the flexibility of the structural design in the light-emitting quantum well layer 10 by the binary compound semiconductor provided in the well layer 12 (see FIG. 1). The binary compound semiconductor is formed in the second ternary compound semiconductor by the shutter control in the MBE crystal growth. For example, the well layers 12 (see FIG. 1) are provided to have the bottom compositions of InGaAs, InGaAs, InAs, InGaAs, InAs, and InGaAs arranged in this order from the upstream side to the downstream side.

Moreover, the compositions of the well layer and the barrier layer can be changed consecutively such as InGaAs, InAs, InGaAs and InAlAs from the upstream side to the downstream side. The InGaAs can be, for example, $In_{0.67}Ga_{0.33}As$. The InAlAs can be, for example, $In_{0.36}Al_{0.64}As$. Thus, the ratio of electrons contributing the intersubband transitions can be controlled more flexibly, thereby making the gain and the luminous efficiency further increase. Multiple layers of InAs or GaAs can be provided in the well layer in the same manner.

According to the embodiment, a quantum cascade laser and a method for manufacturing the quantum cascade laser are provided in which the composition ratios of the well layer and the barrier layer in the quantum well layers can be controlled easily. In other words, the composition ratios of the compound semiconductors can be changed easily in the MBE crystal growth by the shutter control. That is, the molecular beams from the molecular beam sources can be switched by opening and closing shutters, and thus, there is no need to quickly change the crucible temperatures in the molecular beam epitaxy apparatus. Therefore, it is easy in the quantum cascade laser to enlarge the flexibility of structural design and improve characteristics such as the gain, the luminous efficiency, etc. The quantum cascade laser can be utilized widely in gas analysis, detection of hazardous substances, etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A quantum cascade laser, comprising:

a plurality of light-emitting quantum well layers configured to emit infrared laser light by using an intersubband transition; and a plurality of injection quantum well layers configured to relax carrier energy, the light-emitting quantum well layers and the injection quantum well layers being stacked alternately, the injection quantum well layers relaxing the energy of carriers injected from the light-emitting quantum well layers, respectively, the light-emitting quantum well layers and the injection quantum well layers including barrier layers and well layers, the barrier layers including a first ternary compound semiconductor represented by a compositional formula of $In_{0.36}Al_{0.64}As$, the well layers including a second ternary compound semiconductor represented by a compositional formula of $In_{0.67}Ga_{0.33}As$, at least one of the barrier layers of the injection quantum well layers including a first region, a binary compound semiconductor thin film and a second region, the binary compound semiconductor thin film being provided between the first and second regions, the first and second regions being of the first ternary compound semiconductor, the binary compound semiconductor thin film including a binary compound of AlAs, wherein the binary compound semiconductor thin film has a film thickness equal to or less than a thickness of double atomic-monolayers including Al atoms and As atoms, a conduction band edge energy of the binary compound semiconductor thin film of the barrier layers of the injection quantum well layers is higher than a conduction band edge energy of the barrier layers of the light-emitting quantum well layers, and wherein the light emitting quantum well layers includes a well layer that includes another binary compound semiconductor thin layer of GaAs.

2. The laser according to claim 1, further comprising a substrate, wherein the light-emitting quantum well layers and the injection quantum well layers are stacked alternately on the substrate, and the binary compound semiconductor thin film has a surface opposite to the substrate, the surface being stabilized by the As atoms.

3. A quantum cascade laser, comprising:

a first multilayer including a first layer and two second layers, the first layer including a ternary compound semiconductor represented by a compositional formula of $In_{0.67}Ga_{0.33}As$, the two second layers being of another ternary compound semiconductor represented by a compositional formula of $In_{0.36}Al_{0.64}As$, the first layer being provided between the two second layers; and a second multilayer including a third layer and two fourth layers, the third layer including the ternary compound semiconductor, the two fourth layers being of another ternary compound semiconductor, the third layer being provided between the two fourth layers, the first multilayer and the second multilayer being arranged in a first direction, the first to fourth layers being stacked in the first direction, the two fourth layer each including a first sublayer and two second sublayers, the first sublayer being of a binary compound semiconductor of AlAs, the two second sublayers being of said another ternary compound semiconductor, the first sublayer being provided between the two second sublayers in the first direction, wherein the first sublayer of the fourth layer has a layer thickness equal to or less than a layer thickness of double atomic-monolayers that include the binary compound semiconductor, a conduction band edge energy of the first sublayer is higher than a conduction band edge energy of the second layers, and wherein the first layer of the first multilayer further includes a sublayer of another binary compound semiconductor of GaAs.

4. The laser according to claim 3, wherein a plurality of the first multilayers and a plurality of the second multilayers are provided, and the first multilayers and the second multilayers are arranged alternately in the first direction.

5. The laser according to claim 3, further comprising a substrate, wherein the first multilayer and the second multilayer are stacked on the substrate.

6. The laser according to claim 3, wherein energy levels in the first layer of the first multilayer are quantized.

* * * * *